(12) United States Patent
Yoshioka et al.

(10) Patent No.: US 8,513,874 B2
(45) Date of Patent: Aug. 20, 2013

(54) LIGHT EMITTING ELEMENT AND DISPLAY APPARATUS

(75) Inventors: Toshihiro Yoshioka, Kawasaki (JP); Toshiharu Uchida, Yamagata (JP)

(73) Assignee: Pioneer Corporation, Kanagawa (JP)

( * ) Notice: Subject to any disclaimer, the term of this patent is extended or adjusted under 35 U.S.C. 154(b) by 76 days.

(21) Appl. No.: 13/322,028

(22) PCT Filed: Jun. 11, 2009

(86) PCT No.: PCT/JP2009/002646
§ 371 (c)(1),
(2), (4) Date: Dec. 12, 2011

(87) PCT Pub. No.: WO2010/143232
PCT Pub. Date: Dec. 16, 2010

(65) Prior Publication Data
US 2012/0099312 A1    Apr. 26, 2012

(51) Int. Cl.
*H01J 1/62*    (2006.01)
(52) U.S. Cl.
USPC ............................................ 313/501; 313/506
(58) Field of Classification Search
USPC .................... 313/498, 501, 506, 509, 512
See application file for complete search history.

(56) References Cited

U.S. PATENT DOCUMENTS

| | | | |
|---|---|---|---|
| 6,831,409 B2 | 12/2004 | Yamada | |
| 7,045,949 B2 | 5/2006 | Yamada et al. | |
| 7,102,282 B1 | 9/2006 | Yamada et al. | |
| 7,116,308 B1 | 10/2006 | Heeks et al. | |
| 7,402,091 B2 | 7/2008 | Heeks et al. | |
| 7,623,199 B2 | 11/2009 | Domoto | |
| 7,750,563 B2 | 7/2010 | Hasegawa | |
| 2002/0190639 A1 | 12/2002 | Yamada et al. | |
| 2003/0034938 A1 | 2/2003 | Yamada | |
| 2006/0091380 A1 | 5/2006 | Yuuki et al. | |
| 2006/0175966 A1 | 8/2006 | Yamada et al. | |
| 2006/0268195 A1 | 11/2006 | Heeks et al. | |
| 2007/0069996 A1 | 3/2007 | Kuba et al. | |
| 2007/0076141 A1 | 4/2007 | Domoto | |
| 2007/0228943 A1 | 10/2007 | Yamada et al. | |
| 2007/0252520 A1 | 11/2007 | Hasegawa | |
| 2010/0044728 A1 | 2/2010 | Domoto | |

FOREIGN PATENT DOCUMENTS

| | | |
|---|---|---|
| CN | 1396791 | 2/2003 |
| CN | 1941401 | 4/2007 |
| CN | 1941402 | 4/2007 |
| EP | 1154676 | 11/2001 |
| JP | 2002-518803 | 6/2002 |

(Continued)

OTHER PUBLICATIONS

International Search Report, PCT/JP2009/0052646, Jul. 14, 2009.

*Primary Examiner* — Vip Patel
(74) *Attorney, Agent, or Firm* — Young & Thompson (57) ABSTRACT

A light emitting element includes a resonator structure which has a first reflecting member, a second reflecting member, and a light emission layer placed between the first reflecting member and the second reflecting member, part of light resonated between the first reflecting member and the second reflecting member being transmitted through the first reflecting member or the second reflecting member in the resonator structure, and a band absorption filter transmitting the part of the light transmitted through the first reflecting member or the second reflecting member, wherein a wavelength at which the transmission of the band absorption filter has a minimum value is located between a wavelength at which a resonator output spectrum from the resonator structure has a maximum value and a wavelength at which relative luminous efficiency has a maximum value.

9 Claims, 10 Drawing Sheets

(56) References Cited

FOREIGN PATENT DOCUMENTS

| | | |
|---|---|---|
| JP | 2002-367770 | 12/2002 |
| JP | 2002-373776 | 12/2002 |
| JP | 2006-147598 | 6/2006 |
| JP | 2006-156966 | 6/2006 |
| JP | 2007-52971 | 3/2007 |
| JP | 2007-53115 | 3/2007 |
| JP | 2007-103039 | 4/2007 |
| JP | 2007-115679 | 5/2007 |
| JP | 2007-123067 | 5/2007 |
| JP | 2007-123136 | 5/2007 |
| JP | 2007-123137 | 5/2007 |
| JP | 2007-316611 | 12/2007 |
| JP | 4174989 | 8/2008 |
| KR | 2002-0096893 | 12/2002 |
| KR | 10-0872729 | 12/2008 |
| WO | WO 01/39554 | 5/2001 |

LIGHT EMITTING ELEMENT AND DISPLAY APPARATUS

TECHNICAL FIELD

The present invention relates to a light emitting element and a display apparatus.

BACKGROUND ART

Electroluminescence (EL) elements utilizing a substance which emits light by itself through an EL phenomenon when a voltage is applied thereto are known as a type of light emitting element which forms a display apparatus such as a display device and an illumination apparatus. The EL element is a light emitting element of thin film shape in which a light emission layer made from an organic material or an inorganic material is formed between an upper electrode and a lower electrode, and has a structure in which light emission is caused by applying a voltage to the light emission layer with the upper electrode and the lower electrode.

In recent years, development work has been underway on light emitting elements having a resonator structure (so-called microcavity structure) in which one of the upper electrode and the lower electrode is formed of a total reflection mirror and the other is formed of a semi-transmitting mirror allowing transmission of some of wavelengths, thereby resonating light emitted by the light emission layer (see, for example, Patent Documents 1 and 2).

However, the thin-film light emitting element of the resonator structure has color filter characteristics which are sensitive to an intermirror distance (resonator optical path length). For example, if nonuniformity occurs in the resonator optical path length due to manufacture errors during the manufacture process, color coordinates (color purity) and luminance variations in a front direction may be unacceptable.

The resonator structure can be designed with a relatively large margin for color purity. On the other hand, the luminances of light emitting elements for a blue (B) color and a red (R) color may vary unacceptably due to a shift of a central wavelength. For example, if the film thickness (corresponding to the optical path length) associated with the intermirror distance changes approximately 5 nm (approximately 5% of the overall element film thickness), the central wavelength may also change approximately 5 nm. For example, in the blue-color light emitting element in which the design value of the central wavelength is set to 470 nm, if the film thickness increases 5 nm, luminous efficiency at the shifted central wavelength (for example, 475 nm) changes as much as 20% or more to cause a large luminance change and thus a reduction in image quality (luminance ununiformity).

PRIOR ART DOCUMENTS

Patent Documents

[Patent Document 1] Japanese Patent Laid-Open No. 2002-373776
[Patent Document 2] Japanese Patent Laid-Open No. 2002-518803

DISCLOSURE OF THE INVENTION

Problems to be Solved by the Invention

Problems to be solved by the present invention include the abovementioned one, by way of example. It is thus an object of the present invention to provide a technique capable of suppressing luminance variations in a light emitting element having a resonator structure and a display apparatus even when a film thickness deviates from a design value to increase or decrease a resonator optical path length, by way of example.

Means for Solving the Problems

A light emitting element according to the present invention, as described in claim 1, is characterized by including a resonator structure which has a first reflecting member, a second reflecting member, and a light emission layer placed between the first reflecting member and the second reflecting member, part of light resonated between the first reflecting member and the second reflecting member being transmitted through the first reflecting member or the second reflecting member in the resonator structure, and a band absorption filter transmitting the part of the light transmitted through the first reflecting member or the second reflecting member, wherein a wavelength at which the transmission of the band absorption filter has a minimum value is located between a wavelength at which a resonator output spectrum from the resonator structure has a maximum value and a wavelength at which relative luminous efficiency has a maximum value.

A display apparatus according to the present invention, as descried in claim 9, is characterized by including a number of resonator structures, each of the resonator structures having a first reflecting member, a second reflecting member, and a light emission layer placed between the first reflecting member and the second reflecting member, part of light resonated between the first reflecting member and the second reflecting member being transmitted through the first reflecting member or the second reflecting member in the resonator structure, and a band absorption filter transmitting the part of the light transmitted through the first reflecting member or the second reflecting member, the band absorption filter being common to the number of resonator structures, wherein a wavelength at which the transmission of the band absorption filter has a minimum value is located between a wavelength at which a resonator output spectrum from the resonator structure has a maximum value and a wavelength at which relative luminous efficiency has a maximum value.

DESCRIPTION OF REFERENCE NUMERALS

1 SUBSTRATE
2 ANODE
3 ORGANIC LAYER
31 HOLE INJECTION LAYER
32 HOLE TRANSPORT LAYER
33 LIGHT EMISSION LAYER
34 ELECTRON TRANSPORT LAYER
4 CATHODE
5 DIVISION WALL PORTION
6 BAND ABSORPTION FILTER
7 FILTER SUPPORT SUBSTRATE

BEST MODE FOR CARRYING OUT THE INVENTION

A light emitting element and a display apparatus according to preferred embodiments of the present invention will hereinafter be described in detail with reference to the accompanying drawings. In the following, description is made about a display apparatus having light emitting elements which emit light in a red color (R), a green color (G), and a blue color (B), respectively, by way of example. However, the technical scope of the present invention is not interpreted limitedly by the embodiments described below.

(Embodiment 1)

Figure 1:
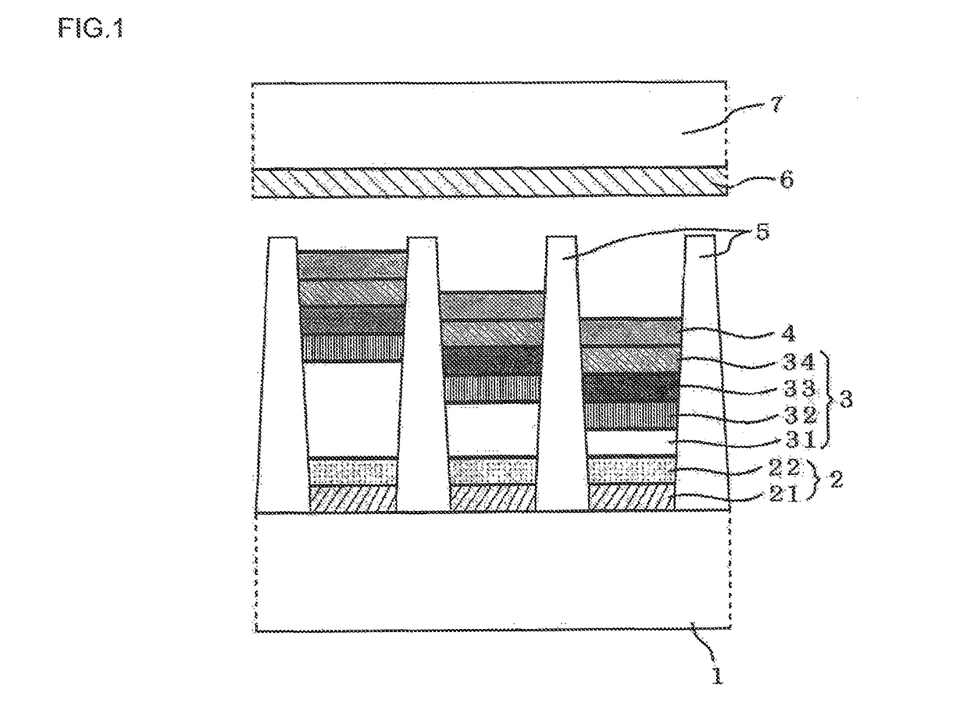
[FIG. 1] A longitudinal section view of RGB light emitting elements according to preferred Embodiment 1 of the present invention.
Figure 2:
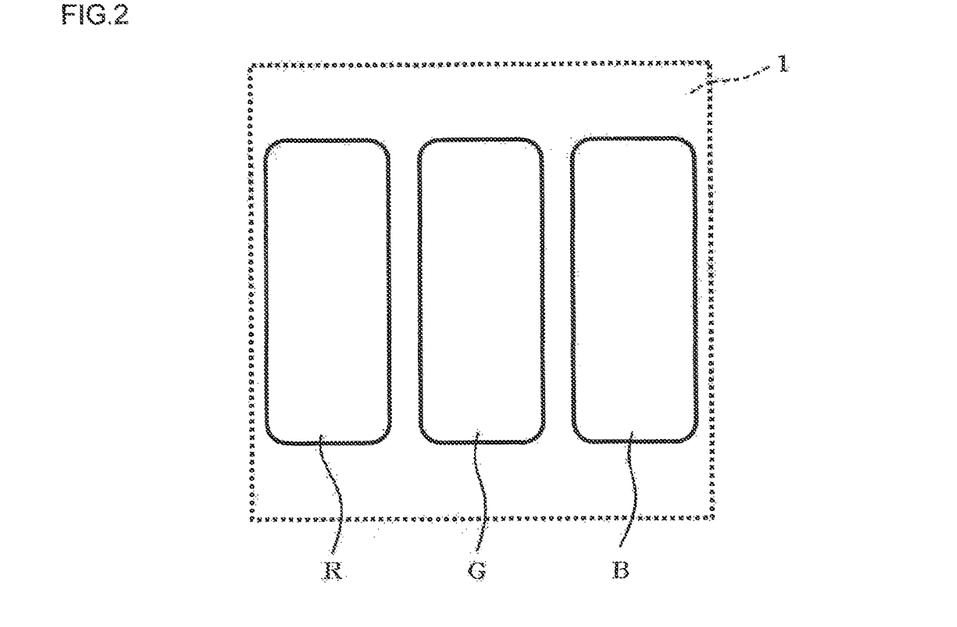
[FIG. 2] A plan view of the RGB light emitting elements according to preferred Embodiment 1 of the present invention.

FIG. 1 and FIG. 2 show an example in which an RGB unit is formed by placing three light emitting elements (R, G, B) which emit light of a red color (R), a green color (G), and a blue color (B) on a common substrate 1. FIG. 1 is a longitudinal section view of the light emitting elements (R, G, B) and FIG. 2 is a plan view thereof. The actual display apparatus has a configuration in which a number of light emitting elements (R, G, B) are arranged on the substrate 1 to form a display region and passive driving is performed by a driving circuit, not shown, placed outside the display region, or active driving is performed by a driving circuit placed for each of the elements.

As shown in FIG. 1, the light emitting elements (R, G, B) according to the present embodiment have a so-called top emission structure in which an anode 2 serving as a first reflecting member, an organic layer 3, and a cathode 4 serving as a second reflecting member are stacked on the substrate and emitted light is taken from the deposited film surface side. The light emitting elements for R, G, B are separated by a division wall portion 5 referred to as a bank. An organic layer or an inorganic layer such as a seal film may be additionally placed on the cathode 4.

In addition, a band absorption filter (BEF) 6 which wavelength-selectively transmits part of light from a resonator structure is placed at a position opposite to the deposited film surface from which the emitted light is taken. The band absorption filter 6 is preferably a filter common to the light emitting elements for R, G, B as shown in FIG. 1. The band absorption filter 6 is supported on a filter support member fixedly placed by a support member, not shown. FIG. 1 shows an example in which the filter support member is formed of a substrate (filter support substrate) 7 made from a transparent material, for example. The filter support member is not limited to the substrate, and a transparent film or the like may be used. Furthermore, a structure or a material for preventing reflection of external light may be added.

The anode 2 has a two-layer structure of a reflecting electrode 21 and a transparent electrode 22. A material having a high work function is used as a material of the anode 2 that is in contact with a hole injection layer 31. Specifically, a metal such as Al, Cr, Mo, Ni, Pt, Au, and Ag, or an alloy or an intermetallic compound containing any of them can be used as a material of the reflecting electrode 21. The reflecting electrode has a thickness of 100 nm, for example. The reflecting electrode 21 desirably has a high reflectance, for example an average reflectance of 80% or higher for light with wavelengths of 400 to 700 nm. As a material of the transparent electrode 22, it is possible to use a metal oxide such as ITO (Indium Tin Oxide) and IZO (Indium Zinc Oxide), by way of example. The transparent electrode 22 has a thickness of 75 nm, for example. Although omitted in FIG. 1 and FIG. 2, a lead electrode (wiring electrode) is connected to the anode 2. The anode 2 may have a single-layer structure of the reflecting electrode 21.

The organic layer 3 may include some of the layers formed of an inorganic material. The organic layer 3 may be divided into more layers or may be formed of a reduced number of stacked layers such that a single layer has functions of a plurality of layers. The organic layer 3 shown in FIG. 1 has a multilayer structure in which the hole injection layer 31, a hole transport layer 32, a light emission layer 33, and an electron transport layer 34 are stacked in order from the side of the anode 2. While it is essential only that the organic layer 3 should have at least the light emission layer 33, it is preferable that the hole injection layer 31, the hole transport layer 32, the electron transport layer 34 and the like are placed to promote the electroluminescence phenomenon efficiently.

When the resonance structure is used, each of the light emitting elements for R, G, B has a preferable resonator optical path length. In the structure of FIG. 1, the distance between a reflecting surface of the reflecting electrode 21 and a reflecting surface of the cathode 4 corresponds to the resonator optical path length. By way of example, a stacked film thickness for providing the preferable resonator optical path length of the red color (R) is 300 nm, a stacked film thickness for providing the preferable resonator optical path length of the green color (G) is 235 nm, and a stacked film thickness for providing the preferable resonator optical path length of the blue color (B) is 200 nm. These resonator optical path lengths are adjusted, for example by the film thickness of the organic layer 3. However, as described above, it is difficult to prevent any deviation of the film thickness from a design value completely in the manufacture process. Especially when the organic layer 3 is deposited through an application method, the control of the film thickness is difficult. For example, when an inkjet method is used for the deposition, nonuniformity of 5% or more may occur in the film thickness among elements.

In the structure shown in FIG. 1, the resonator optical path length is adjusted by changing the thickness of the hole injection layer 31, by way of example. Specifically, the thickness (design value) of the hole injection layer 31 for the red color (R) is 125 nm, for example, the thickness (design value) of the hole injection layer 31 for the green color (G) is 65 nm, for example, and the thickness (design value) of the hole injection layer 31 for the blue color (B) is 20 nm, for example. The hole transport layers 32, the light emission layers 33, and the electron transport layers 34 are provided to have the same thicknesses among the resonator structures for R, G, B. The thickness (design value) of the hole transport layer 32 is 30 nm, for example, the thickness (design value) of the light emission layer 33 is 30 nm, for example, and the thickness (design value) of the electron transport layer 34 is 40 nm, for example.

Each of the hole injection layer 31 and the hole transport layer 32 may be formed of a material having an excellent hole transport property. Examples of usable organic materials include a phthalocyanine compound such as copper phthalocyanine (CuPc), starburst type amine such as m-MTDATA, a multimer of benzidine type amine, aromatic tertiary amine such as 4,4'-bis[N-(1-naphtyl)-N-phenylamino]-biphenyl (NPB) and N-phenyl-p-phenylenediamine (PPD), a stilbene compound such as 4-(di-P-tolylamino)-4'-[4-(di-P-tolylamino)styryl]stylbenzene, a triazole derivative, a styrylamine compound, and a fullerene such as buckyball and $C_{60}$. It is also possible to use a material of a polymer dispersed type provided by dispersing a low-molecular material in a high-molecular material such as polycarbonate. However, the material of the layers 31 and 32 is not limited thereto.

For the light emission layer 33, it is possible to use a material producing the electroluminescence phenomenon for the red color (R), the green color (G), and the blue color (B). Examples of usable materials of the light emission layer 33 include a fluorescent organic metal compound such as (8-hydroxyquinolinate)aluminum complex ($Alq_3$), a aromatic dimethylidine compound such as 4,4'-bis(2,2'-diphenylvinyl)-biphenyl (DPVBi), a styrylbenzene compound such as 1,4-bis(2-methylstyryl)benzene, a triazole derivative such as 3-(4-biphenyl)-4-phenyl-5-t-butylphenyl-1,2,4-triazole (TAZ), a anthraquinone derivative, a fluorescent organic material such as a fluonorene derivative, a polymer material of polyparaphenylene vinylene (PPV) base, polyfluorene base, and polyvinylcarbazole (PVK) base, and a phosphorescent organic material such as a platinum complex and an iridium complex. However, the material of the layer 33 is not limited thereto. In addition, the organic material is not essential, and an inorganic material producing the electroluminescence phenomenon may be used.

The electron transport layer 34 may be formed of a material having an excellent electron transport property. Examples of usable materials include an organic material such as a silacyclopentadiene (silole) derivative such as PyPySPyPy, a nitro-substituted fluorenone derivative, and an anthraquinodimethane derivative, a metal complex of a 8-quinolinole derivative such as tris(8-hydroxyquinolinate)aluminum ($Alq_3$), metal phthalocyanine, a triazole-based compound such as 3-(4-biphenyl)-5-(4-t-butylphenyl)-4-phenyl-1,2,4-triazole (TAZ), an oxadiazole-based compound such as 2-(4-biphenylyl)-5-(4-t-butyl)-1,3,4-oxadiazole (PBD), and a fullerene such as buckyball, $C_{60}$, and carbon nanotube. However, the material of the layer 34 is not limited thereto.

As a material of the cathode 4, it is possible to use a material which has a low work function in the region in contact with the electron transport layer 34 and has a small loss in reflection and transmission in the whole cathode. Specifically, it is possible to use a single layer or a stacked layer of metal such as Al, Mg, Ag, Au, Ca, and Li or a compound of any of them or an alloy containing any of them as the material of the cathode 4. A thin layer of lithium fluoride or lithium oxide may be formed in the region in contact with the electron transport layer 34 to control the electron injection property. The thickness of the cathode 4 is 10 nm, for example. As described above, the present embodiment has the top emission structure in which light is output from the deposited film surface side or the cathode side. Thus, the cathode 4 is a semi-transmitting electrode which has an average value of 20% or higher of transmittance for light with wavelengths of 400 to 700 nm, by way of example. The transmittance can be adjusted, for example by the film thickness of the electrode. Although omitted in FIG. 1 and FIG. 2, a lead electrode (wiring electrode) is connected to the cathode 4.

For placing the seal film on the cathode 4, the film may be formed, for example, of a transparent inorganic material having a low transmittance of water vapor or oxygen. Examples of usable materials of the seal film include silicon nitride (SiNx), silicon oxynitride (SiOxNy), aluminum oxide (AlOx), and aluminum nitride (AlNx).

As a material of the division wall portion 5 referred to as the bank, a photosensitive resin containing a fluorine component can be used, for example. Since the fluorine component contained can provide a liquid-repellent property to a liquid material, a liquid flow (so-called overlap) can be suppressed when the application method is used for the deposition. In addition, the division wall portion 5 is preferably made from a material having a light shielding property.

As the band absorption filter (BEF) 6, it is possible to use a filter for single band absorption having the absorption characteristics of generally Gaussian shape, for example. The shape or the material of the band absorption filter 6 is not limited as long as it has the following absorption characteristics. By way of example, the band absorption filter 6 may be provided by attaching a filter of film shape or plate shape to a display surface or by applying or adhering a pigment having the following absorption characteristics to a display surface. However, since the filter is for single band absorption, the absorption characteristics of the filter depend on which of the blue color (B), the red color (R), and the green color (G) is used as a color of interest. In the following, description is made about a case where the blue color (B) is used as the color of interest, as a preferable example. For convenience of description, the wavelength where light emission intensity is at the maximum may be referred to as a central wavelength in the following description.

Figure 3:
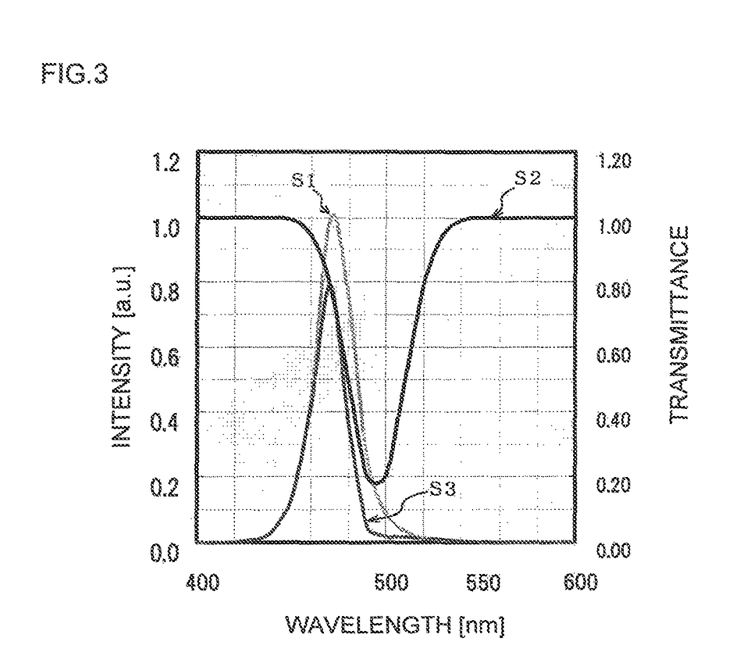
[FIG. 3] A diagram showing the characteristics of a band absorption filter when a blue color (B) is used as a color of interest.

As shown in FIG. 3, when the blue color (B) is used as the color of interest, the central wavelength (λB) of an output spectrum (hereinafter referred to as a resonator output spectrum) S1 from the resonator structure is 470±10 nm. The range of ±10 nm is set because the central wavelength (λB) for taking the NTSC color purity depends on the width of the resonator output spectrum S1 and PL form. The shift width of the central wavelength (λB) due to nonuniformity of the film thickness is also taken into account. On the other hand, the central wavelength of a relative luminous efficiency spectrum is 555 nm for standard photopic vision. In this case, the present embodiment employs the band absorption filter 6 having a transmission spectrum S2 with an absorption central wavelength (λa) of 495 nm, as a preferable example. More preferably, peak absorption is 60% or more when base absorption is assumed to be 0%. FIG. 3 also shows a spectrum (hereinafter referred to as a light emission output spectrum) S3 of light output through the band absorption filter 6 when the film thickness is formed according to the design value.

Figure 4:
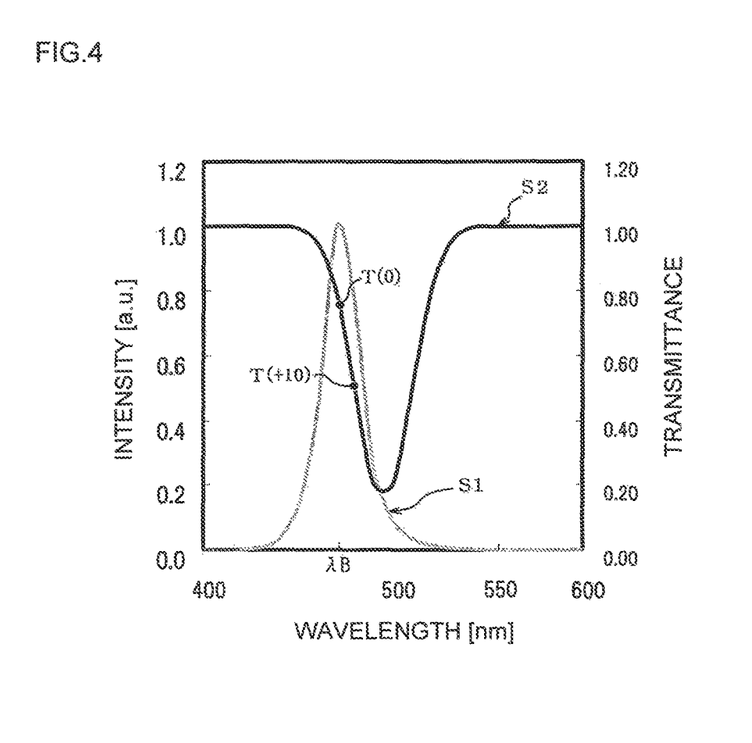
[FIG. 4] A diagram showing the characteristics of the band absorption filter when the blue color (B) is used as a color of interest.

More specifically, the absorption spectrum S2 of the band absorption filter 6 is close to the resonator output spectrum S1 and has an absorption rate which monotonously increases from the central wavelength (λB) of the resonator output spectrum S1 toward longer wavelengths. As an important factor, the change of transmittance near the central wavelength of the resonator output spectrum S1 is preferably sufficient for suppressing luminance variations. Specifically, as shown in FIG. 4, assuming that the transmittance at the central wavelength (λB) is T(0), and the transmittance at a wavelength +10 nm from the central wavelength is T(10), the ratio ΔT of the transmittances [=T(10)/T(0)] is preferably 0.9 or lower, more preferably 0.7 or lower, and more preferably 0.6 or lower.

As described above, the present embodiment has the configuration in which the band absorption filter 6 satisfying the abovementioned absorption conditions is used to absorb part of the light output from the resonator structure. Specifically, the band absorption filter 6 controls the spectrum shape near the central wavelength (λB) such that light emission output is reduced when the central wavelength (λB) of the resonator output spectrum S1 is shifted toward higher levels of luminous efficiency (~480 nm) and that light emission output is increased when the central wavelength (λB) is shifted toward lower levels of luminous efficiency (~460 nm). With the configuration, for example even when the film thickness deviates from a design value within a range of ±10 nm to cause non-uniformity of the resonator optical path length, luminance variations can be suppressed. In this case, a deviation Δu'v' of chromaticity coordinates from the NTSC color purity is 0.05 or smaller or corresponds to chromaticity coordinates extending the NTSC color reproduction range and satisfies favorable color purity for color display.

In the following, the suppression of luminance variations is described with reference to more specific simulation results. However, the following simulation results are only illustrative and do not limit the present embodiment.

Figure 5:
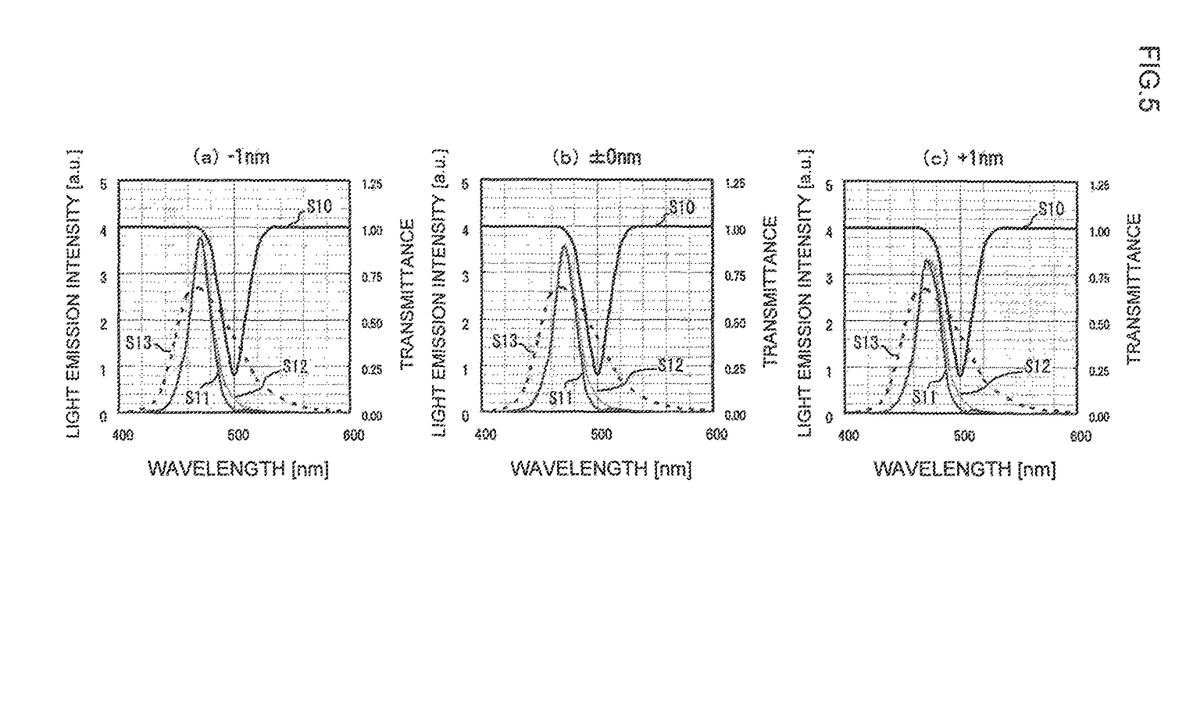
[FIG. 5] A diagram showing the relationship between a film thickness and a light emission spectrum in the abovementioned light emitting element.

When the design value of the central wavelength (λB) of the resonator output spectrum S1 is set, for example to 472 nm, FIG. 5(a) shows the simulation results when the film thickness is changed −1 nm from the design value. FIG. 5(b) shows the simulation results when the film thickness is formed according to the design value. FIG. 5(c) shows the simulation results when the film thickness is changed +1 nm from the design value. The band absorption filter 6 used in this case has the absorption characteristics of generally Gaussian shape with an absorption central wavelength (λa) of 500 nm and an absorption coefficient σ of 10 nm. The ratio ΔT of transmittances [=T(10)/T(0)] is approximately 0.9.

Of spectra shown in FIG. 5, a spectrum S10 represents a transmission spectrum of the band absorption filter 6, and a spectrum S11 represents a light emission output spectrum output through the band absorption filter 6. A spectrum S12 represents a light emission output spectrum when the band absorption filter 6 is not provided for comparison purposes. A spectrum S13 represents a photoluminescence spectrum which is inner light emission when light is emitted without using the resonator structure.

Figure 6:
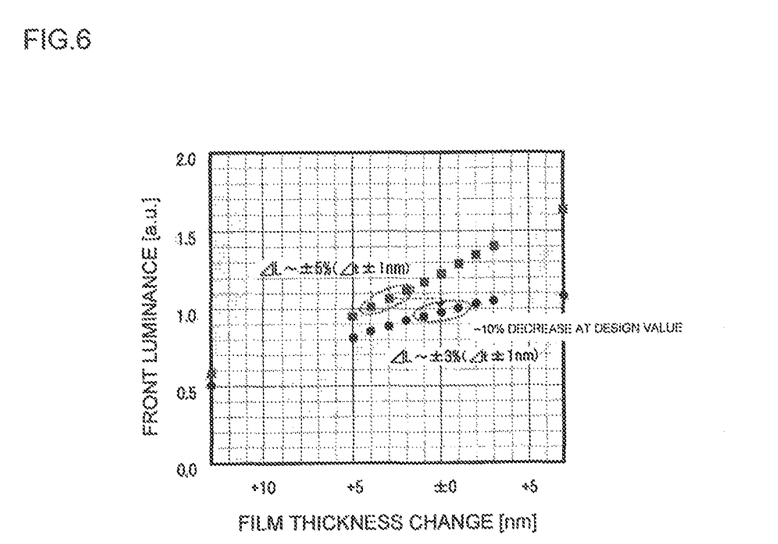
[FIG. 6] A diagram showing the relationship between a film thickness and luminance in the abovementioned light emitting element.

FIG. 6 shows the results of simulation of changes in front luminance when the film thickness increases or decreases near the design value.

As seen from the simulation results in FIG. 5, the use of the band absorption filter 6 satisfying the abovementioned conditions achieves the control such that the light emission output is reduced when the central wavelength (λB) of the resonator output spectrum S1 is shifted toward higher levels of luminous efficiency and that the light emission output is increased when the central wavelength (λB) is shifted toward lower levels of luminous efficiency. With such control, while the light emission intensity varies due to an increase or decease in film thickness, luminance variations associated with an increase or decrease in film thickness are suppressed as seen from the simulation results in FIG. 6. Specifically, when the band absorption filter 6 is not used, a luminance change of ±5% occurs in association with a film thickness change of ±1 nm near the design value, whereas, when the band absorption filter 6 is used, a luminance change is suppressed to approximately ±3% in association with a film thickness change of ±1 nm although the luminance decreases approximately 10% near the design value. The design value is obtained by optimization of light emission after the transmission through the filter for the luminance and chromaticity.

Figure 7:
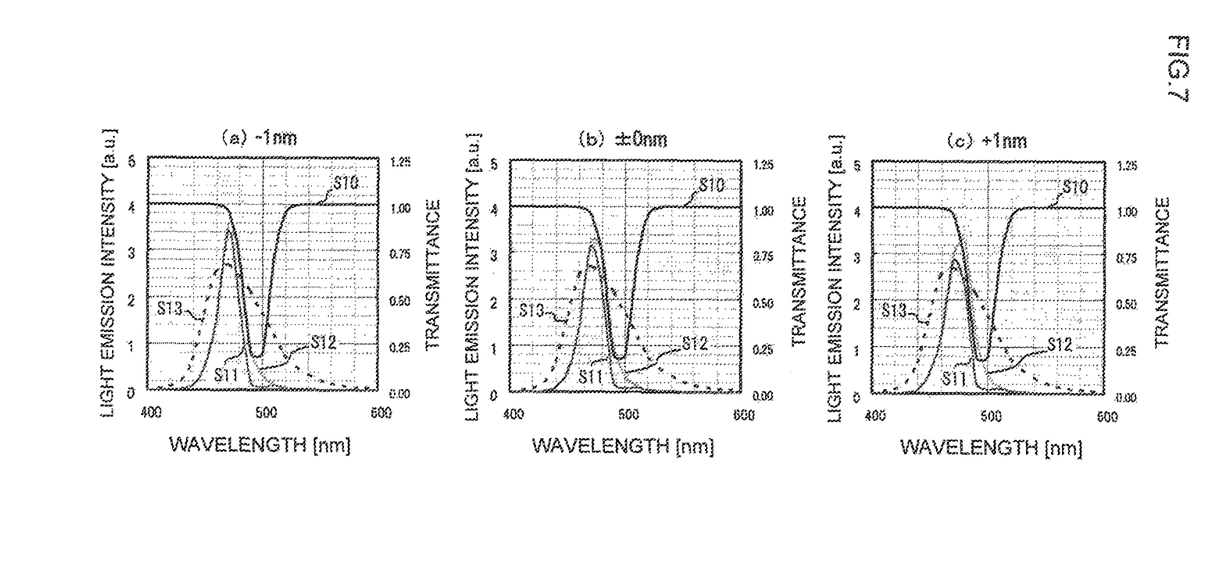
[FIG. 7] A diagram showing the relationship between a film thickness and a light emission spectrum in the abovementioned light emitting element.
Figure 8:
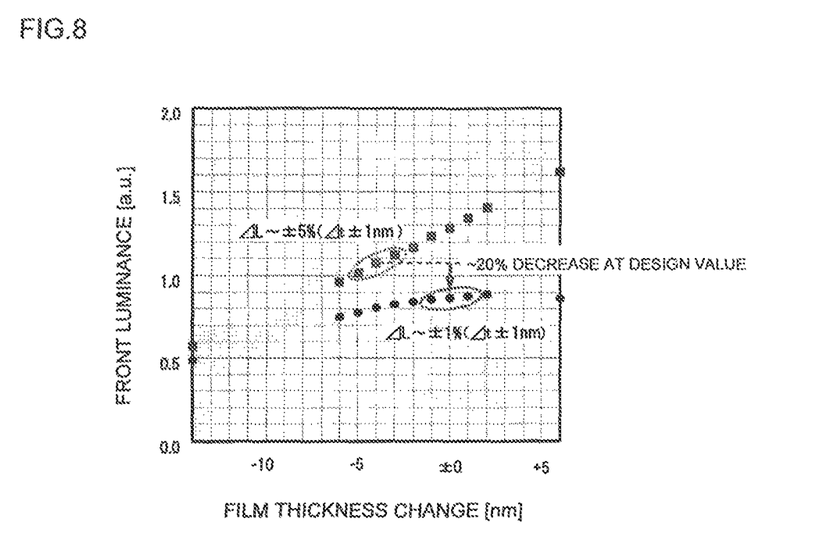
[FIG. 8] A diagram showing the relationship between a film thickness and luminance in the abovementioned light emitting element.

As another example, FIG. 7 shows the simulation results when the band absorption filter 6 having the absorption characteristics of generally Gaussian shape with an absorption central wavelength of 495 nm and an absorption coefficient σ of 10 nm is used. The ratio ΔT of transmittances [=T(10)/T(0)] is approximately 0.7. In this case, the behavior of spectra tends to be similar to those in FIG. 5, but the reduction in the value of the ratio ΔT of transmittances leads to a wider range of variations in light emission output associated with an increase or decrease in film thickness. Consequently, as seen from the simulation results in FIG. 8, a luminance change is suppressed to approximately ±1% in association with a film thickness change of ±1 nm in terms of luminance variations associated with an increase or decrease in film thickness although the luminance decreases approximately 20% near the design value. In other words, the use of the band absorption filter 6 having the large transmittance change near the central wavelength of the resonator output spectrum S1 can suppress luminance variations more reliably.

Figure 9:
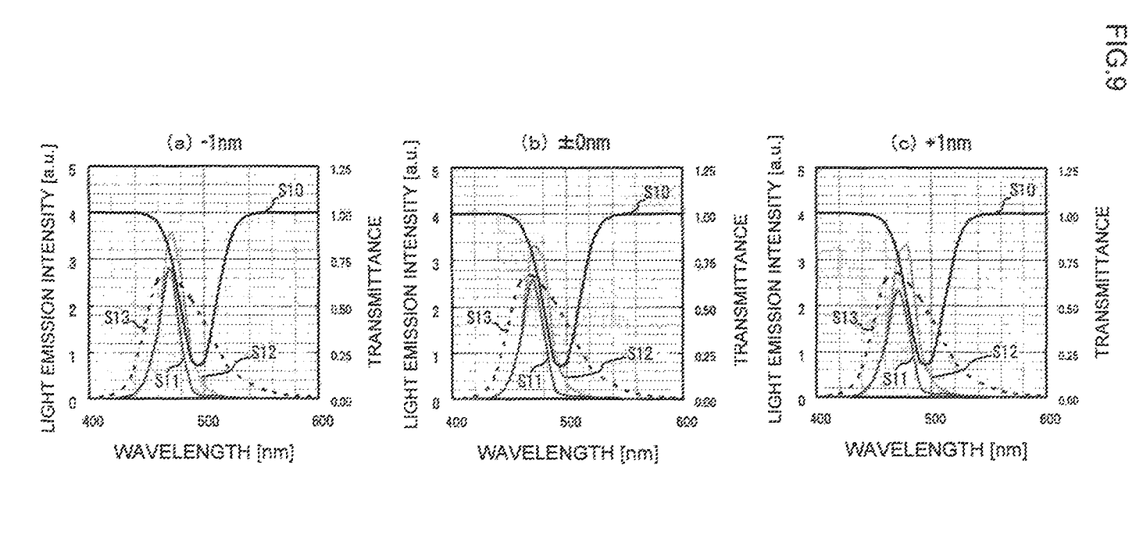
[FIG. 9] A diagram showing the relationship between a film thickness and a light emission spectrum in the abovementioned light emitting element.
Figure 10:
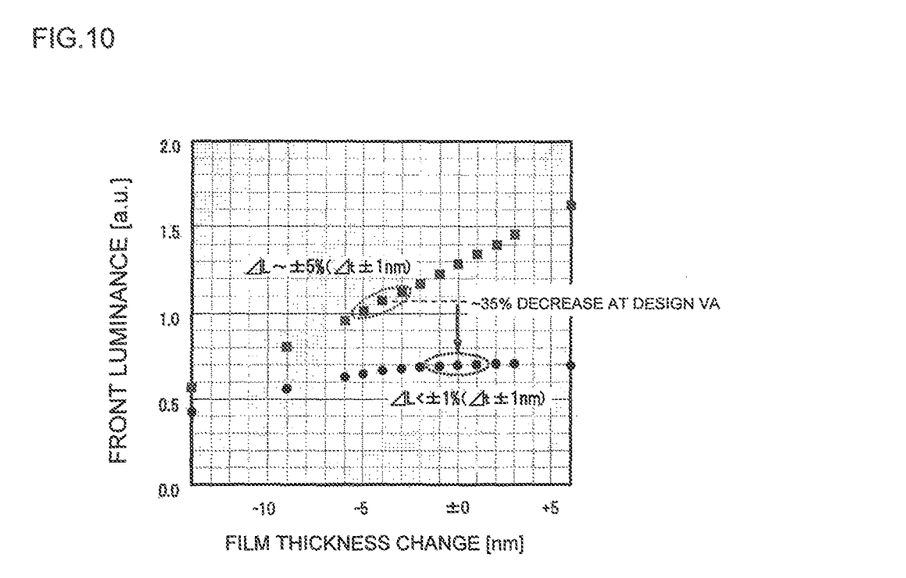
[FIG. 10] A diagram showing the relationship between a film thickness and luminance in the abovementioned light emitting element.

As another example, FIG. 9 shows the simulation results when the band absorption filter 6 having the absorption characteristics of generally Gaussian shape with an absorption central wavelength of 495 nm and an absorption coefficient σ of 15 nm is used. The ratio ΔT of transmittances [=T(10)/T(0)] is approximately 0.6. In this case, the behavior of spectra tends to be similar to those in FIG. 5 and FIG. 7, but the further reduction in the value of the ratio ΔT of transmittances leads to a wider range of variations in light emission output associated with an increase or decrease in film thickness. Consequently, as seen from the simulation results in FIG. 10, a luminance change can be reduced to approximately zero with sufficient color purity maintained in terms of luminance variations associated with an increase or decrease in film thickness although the luminance decreases approximately 35% near the design value. In other words, the use of the band absorption filter 6 having the larger transmittance change near the central wavelength of the resonator output spectrum S1 can suppress luminance variations more reliably.

Figure 11:
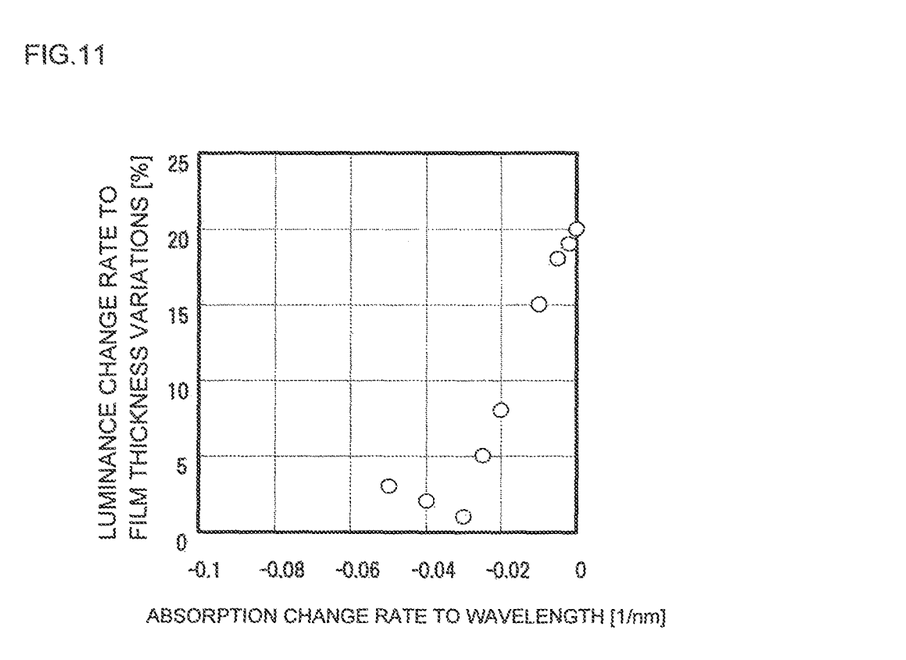
[FIG. 11] A diagram showing the relationship between an absorption change rate of the band absorption filter and a luminance change rate in the abovementioned light emitting element.

FIG. 11 shows the results of simulation of the relationship between an absorption change rate $R_A$ of the band absorption filter 6 at the central wavelength (λB) of the resonator output spectrum S1 and a luminance change rate RL (%) to film thickness variations. The absorption change rate $R_A$ is provided by dividing the gradient of the absorption spectrum at the central wavelength (λB) by the absorption rate at the wavelength λB, and is calculated with a calculation expression $R_A$ [1/nm]=[dA(λB)/dλ]/A(λB). The luminance change rate RL (%) is the change rate in luminance to film thickness variations of d0±2 nm when the optimal film thickness satisfying the NTSC color purity is assumed to be d0. More specifically, the rate RL (%) is the value calculated as follows: the luminance change rate RL [%]=[difference from maximum to minimum luminance at d0±2 nm]/[luminance at d0]× 100. As seen from the results shown in FIG. 11, the absorption change rate $R_A$ [1/nm] in the light emitting element for the blue color (B) is preferably −0.01 or lower, and more preferably, −0.02 or lower.

While the first and second reflecting members are formed of the reflecting electrode and the semi-transmitting electrode, respectively, in the light emitting elements shown in FIG. 1, the present embodiment is not limited thereto, and a reflecting film different from the electrode may be formed. In this case, an anode or a cathode closer to the reflecting film different from the electrode is preferably provided as a transparent electrode.

(Embodiment 2)

The present embodiment is a modification of Embodiment 1, and is an embodiment in which the red color (R) is used as a color of interest in control with the band absorption filter 6.

Figure 12:
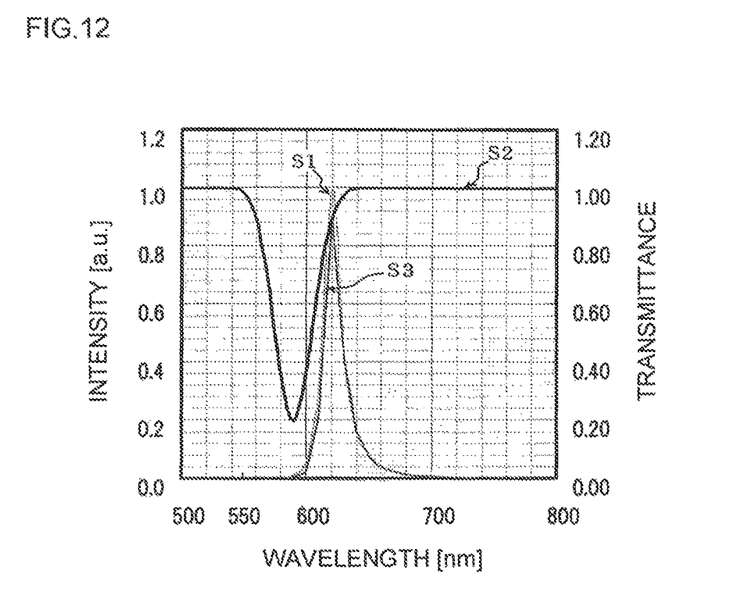
[FIG. 12] A diagram showing the characteristics of a band absorption filter when a red color (R) is used as a color of interest.

As shown in FIG. 12, when the red color (R) is used as the color of interest, the central wavelength (λR) of a resonator output spectrum S1 is 620±20 nm. The range of ±20 nm is set because the central wavelength (λR) for taking the NTSC color purity depends on the width of the resonator output spectrum S1 and PL form. The shift width of the central wavelength (λR) due to nonuniformity of the film thickness is also taken into account. On the other hand, the central wavelength of relative luminous efficiency is 555 nm for standard photopic vision. In this case, the present embodiment employs the band absorption filter 6 having a transmission spectrum S2 with an absorption central wavelength (λa) of 590 nm, as a preferable example. More preferably, peak absorption is 60% or more when base absorption is assumed to be 0%. FIG. 12 also shows a light emission output spectrum S3 output through the band absorption filter 6 when the film thickness is formed according to the design value.

Figure 13:
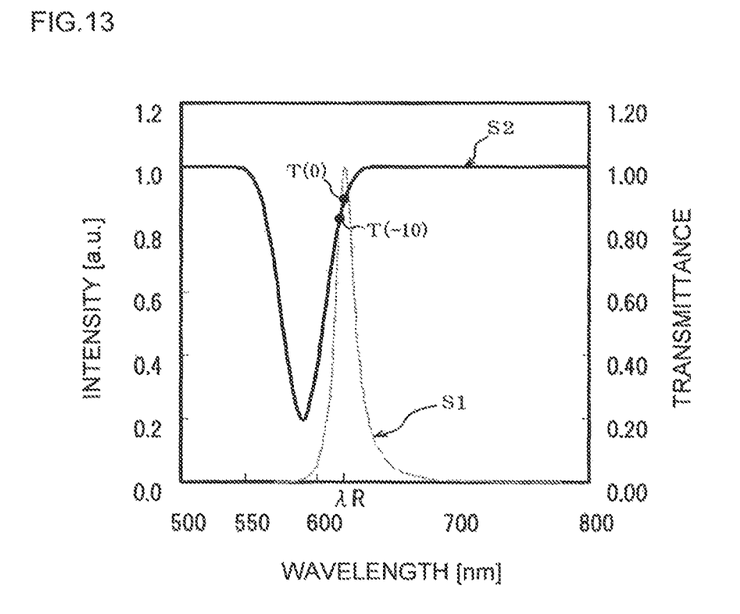
[FIG. 13] A diagram showing the characteristics of the band absorption filter when the red color (R) is used as a color of interest.

More specifically, the absorption spectrum S2 of the band absorption filter 6 is close to the resonator output spectrum S1 and has an absorption rate which monotonously decreases from the central wavelength (λR) of the resonator output spectrum S1 toward longer wavelengths. As an important factor, the change of transmittance near the central wavelength of the resonator output spectrum S1 is preferably sufficient for suppressing luminance variations. Specifically, as shown in FIG. 13, assuming that the transmittance at the central wavelength (λR) is T(0), and the transmittance at a wavelength −10 nm from the central wavelength is T(−10), the ratio ΔT of the transmittances [=T(−10)/T(0)] is preferably 0.9 or lower, more preferably 0.7 or lower, and more preferably 0.6 or lower.

Similarly to FIG. 11, as a result of simulation of the relationship between an absorption change rate $R_A$ of the band absorption filter 6 at the central wavelength (λR) of the resonator output spectrum S1 and a luminance change rate RL (%) to film thickness variations, the absorption change rate $R_A$ [1/nm] in the light emitting element for the red color (R) is preferably +0.01 or higher, and more preferably, +0.02 or higher.

As described above, when the red color (R) is used as the color of interest, the band absorption filter 6 also controls the spectrum shape near the central wavelength (λR) such that light emission output is reduced when the central wavelength (λR) of the resonator output spectrum S1 is shifted toward higher levels of luminous efficiency and that light emission output is increased when the central wavelength (λR) is shifted toward lower levels of luminous efficiency. Thus, similarly to the case of the blue color (B), for example even when the film thickness deviates from a design value within a range of ±10 nm to cause nonuniformity of the resonator optical path length, luminance variations can be suppressed.

(Embodiment 3)

The present embodiment is a modification of Embodiments 1 and 2, and is an embodiment in which both of the blue color (B) and the red color (R) are used as colors of interest in control with the band absorption filter 6.

Specifically, both of a band absorption filter having the absorption characteristics in Embodiment 1 and a band absorption filter having the absorption characteristics in Embodiment 2 are provided and the two layers are stacked. In this case, the effect of suppression of luminance variations can be achieved by the filters without individually forming for the light emitting elements for the blue color (R) and the red color (R). However, the present embodiment is not limited to the configuration of the two-layer stack, and the filters may be placed individually for the light emitting elements for the blue color (B) and the red color (R). Such a configuration can suppress luminance variations in both of the blue color (B) and the red color (R).

In addition, the present embodiment is not limited to the provision of the two filters, and it is possible to use a single filter for two-band absorption which satisfies both of the conditions of the absorption characteristics in Embodiment 1 and the conditions of the absorption characteristics in Embodiment 2, for example.

(Embodiment 4)

Figure 14:
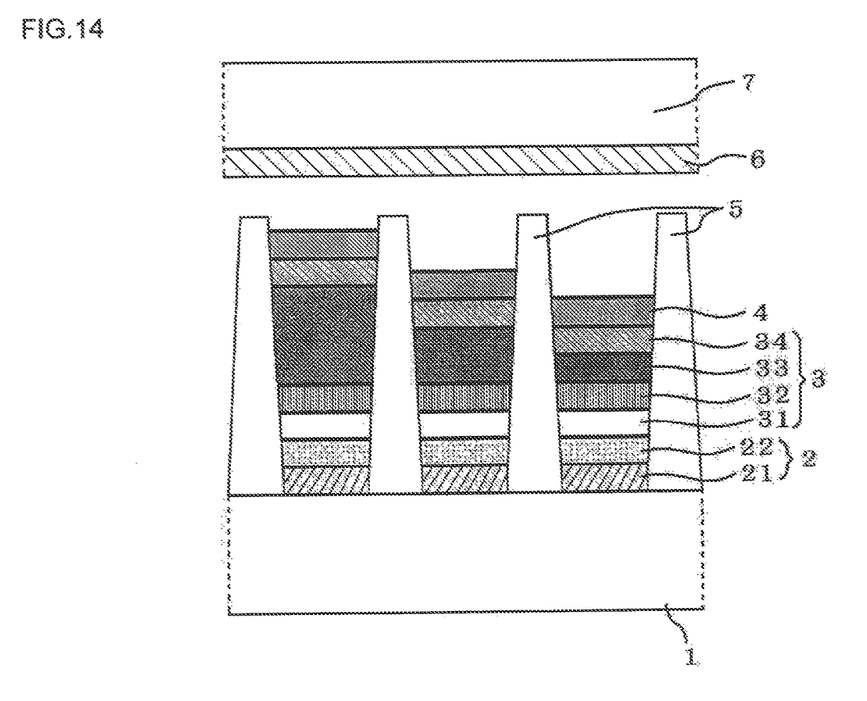
[FIG. 14] A longitudinal section view of light emitting elements according to preferred Embodiment 4 of the present invention.

Embodiments 1 to 3 have shown the example in which the thickness of the hole injection layer 31 is changed to adjust the resonator optical path length for RGB. However, the present embodiment is not limited thereto, and the thickness of the light emission layer 33 may be changed to adjust the resonator optical path length as shown in FIG. 14.

(Embodiment 5)

Figure 15:
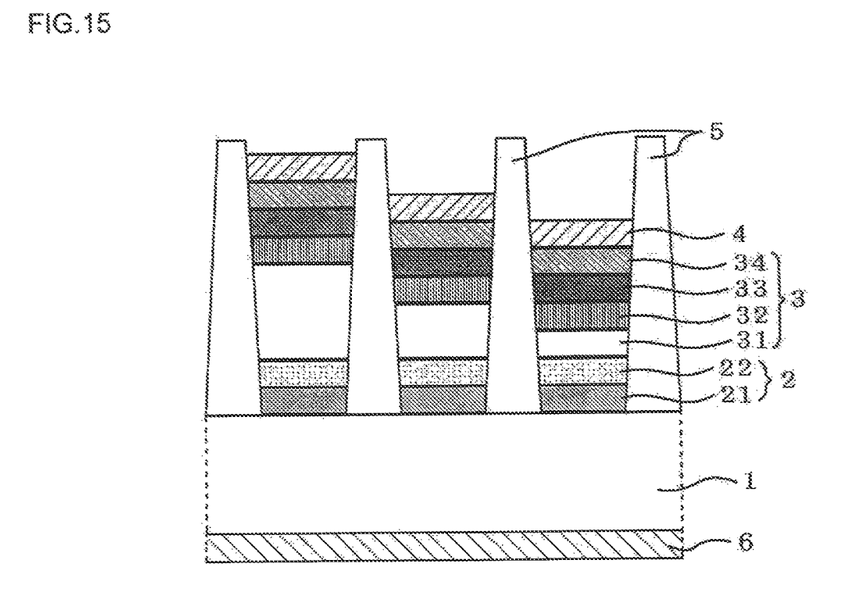
[FIG. 15] A longitudinal section view of light emitting elements according to preferred Embodiment 5 of the present invention.

Embodiments 1 to 4 have described the light emitting elements of the top emission structure taken as an example. However, the present embodiment is not limited to this structure, and a bottom emission structure may be used as shown in FIG. 15. FIG. 15 shows an example in which the reflecting electrode 21 in FIG. 1 is formed as a semi-transmitting electrode and the cathode is formed as a reflecting electrode to provide the bottom emission structure. The band absorption filter 6 in this case may be placed on the substrate 1 as shown in FIG. 15 or may be placed opposite to the substrate 1 by using the filter support substrate 7 as shown in FIG. 1. However, the structure is not limited thereto.

(Embodiment 6)

Next, an example of the procedure for manufacturing the RGB light emitting elements shown in FIG. 1 is described.

First, the reflecting electrode 21 and the transparent electrode 22 are deposited in order, for example by using a vapor deposition or a sputtering method. The patterning of the electrodes 21 and 22 can be performed with a photolithography method, for example. Then, a photosensitive resin containing a fluorine component is applied onto the substrate 1, dried and deposited, and then the division wall portion 5 having the pattern as shown in FIG. 1 is formed with the photolithography method, by way of example. For the passive type as an example, the electrodes 21 and 22 are formed into stripes, and then the division wall portion 5 is formed. On the other hand, for the active type as an example, after the electrodes 21 and 22 are formed into islands connected for each driving circuit, the division wall portion 5 is formed.

Next, the liquid material of the hole injection layer 31 is applied, for example with an inkjet nozzle, to the region defined by the division wall portion 5, and is dried and deposited. The hole transport layer 32 and the light emission layer 33 are also applied and deposited for each of the elements with the application method. The film thickness can be adjusted, for example by the application amount of the liquid material. Then, the electron transport layer 34 and the cathode 4 are formed in order with the evaporation method. The patterning of the cathode 4 can be performed by using a mask such as a metal mask or by utilizing the bank shape of the division wall portion 5. For the passive type as an example, the cathode 4 can be patterned in stripes. On the other hand, for the active type as an example, a so-called solid electrode can be used without performing patterning.

Finally, the filter support substrate 7 having the band absorption filter 6 of film shape attached thereto is placed at the position opposite to the deposited film surface from which emitted light is taken. In this manner, the RGB light emitting elements shown in FIGS. 1 and 2 can be manufactured.

As described above, according to Embodiments 1 to 6, the band absorption filter having the wavelength at which the transmission has the minimum value between the wavelength at which the resonator output spectrum from the resonator structure has the maximum value and the wavelength at which the relative luminous efficiency has the maximum value is used to transmit wavelength-selectively part of the light from the resonator structure, thereby allowing suppression of luminance variations caused by variations in the resonator optical path length. In other words, since only small luminance variations occur even when the film thickness deviates from the design value, the permissible range of nonuniformity of the film thickness can be widened, so that the yield can be improved and the cost can be reduced.

The technique according to the abovementioned embodiments can be applied not only to the organic thin-film light emitting element but also to an inorganic thin-film light emitting element having a stacked element structure (electroluminescence, light emitting diode). The technique is also applicable to a display apparatus of a light emission type in which light emitting elements are placed in an array on a plane. The structure may be formed such that emitted light is taken from both of the first and second reflecting members. In addition, the color is not limited to the three colors of RGB, but one color or two colors may be used, or another color may be included.

While the present invention has been described in detail in conjunction with the specific embodiments, it is apparent to those skilled in the art that various substitutions, modifications, changes and the like in forms and details may be made without departing from the spirit and scope of the present invention as specified by the claims. Thus, the scope of the present invention is not limited to the above embodiments and the accompanying drawings but should be defined on the basis of the claims and the equivalents thereof.

The invention claimed is:

1. A light emitting element comprising a resonator structure which has a first reflecting member, a second reflecting member, and a light emission layer placed between the first reflecting member and the second reflecting member, part of light resonated between the first reflecting member and the second reflecting member being transmitted through the first reflecting member or the second reflecting member in the resonator structure; and a band absorption filter transmitting the part of the light transmitted through the first reflecting member or the second reflecting member, wherein a wavelength at which the transmission of the band absorption filter has a minimum value is located between a wavelength at which a resonator output spectrum from the resonator structure has a maximum value and a wavelength at which relative luminous efficiency has a maximum value.

2. The light emitting element according to claim 1, wherein the wavelength at which the resonator output spectrum has the maximum value lies within a range of 470±10 nm, and wherein, when a transmittance of the band absorption filter at the wavelength at which the resonator output spectrum has the maximum value is T(0), and a transmittance at a wavelength +10 nm from the wavelength at which the resonator output spectrum has the maximum value is T(10), a ratio ΔT of the transmittances [=T(10)/T(0)] is 0.9 or lower.

3. The light emitting element according to claim 2, wherein the ratio ΔT of the transmittances is 0.7 or lower.

4. The light emitting element according to claim 1, wherein a transmission change rate $R_A$ of the band absorption filter is −0.01 [1/nm] or lower.

5. The light emitting element according to claim 1, wherein the wavelength at which the resonator output spectrum has the maximum value lies within a range of 620±20 nm, and wherein, when a transmittance of the band absorption filter at the wavelength at which the resonator output spectrum has the maximum value is T(0), and a transmittance at a wavelength −10 nm from the wavelength at which the resonator output spectrum has the maximum value is T(−10), a ratio ΔT of the transmittances [=T(−10)/T(0)] is 0.9 or lower.

6. The light emitting element according to claim 5, wherein the ratio ΔT of the transmittances is 0.7 or lower.

7. The light emitting element according to claim 1, wherein a transmission change rate $R_A$ of the band absorption filter is +0.01 [1/nm] or higher.

8. The light emitting element according to claim 1, wherein a deviation Δu'v' of chromaticity coordinates from NTSC color purity is 0.05 or smaller or corresponds to chromaticity coordinates extending an NTSC color reproduction range.

9. A display apparatus comprising a number of resonator structures, each of the resonator structures having a first reflecting member, a second reflecting member, and a light emission layer placed between the first reflecting member and the second reflecting member, part of light resonated between the first reflecting member and the second reflecting member being transmitted through the first reflecting member or the second reflecting member in the resonator structure; and a band absorption filter transmitting the part of the light transmitted through the first reflecting member or the second reflecting member, the band absorption filter being common to the number of resonator structures, wherein a wavelength at which the transmission of the band absorption filter has a minimum value is located between a wavelength at which a resonator output spectrum from the resonator structure has a maximum value and a wavelength at which relative luminous efficiency has a maximum value.

* * * * *